United States Patent
Kato et al.

(10) Patent No.: US 8,349,702 B2
(45) Date of Patent: Jan. 8, 2013

(54) METHOD FOR MANUFACTURING SEMICONDUCTOR SUBSTRATE

(75) Inventors: Sho Kato, Ebina (JP); Satoshi Toriumi, Ebina (JP); Fumito Isaka, Zama (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 488 days.

(21) Appl. No.: 12/426,305

(22) Filed: Apr. 20, 2009

(65) Prior Publication Data

US 2009/0269906 A1    Oct. 29, 2009

(30) Foreign Application Priority Data

Apr. 24, 2008 (JP) ................................. 2008-113320

(51) Int. Cl.
*H01L 21/30* (2006.01)
*H01L 21/46* (2006.01)

(52) U.S. Cl. ........ 438/458; 438/459; 438/455; 438/456; 438/457; 216/33

(58) Field of Classification Search .................... None
See application file for complete search history.

(56) References Cited

U.S. PATENT DOCUMENTS

| | | | |
|---|---|---|---|
| 5,374,564 A | 12/1994 | Bruel | |
| 6,284,629 B1 * | 9/2001 | Yokokawa et al. | ........... 438/459 |
| 6,534,380 B1 | 3/2003 | Yamauchi et al. | |
| 6,946,354 B2 | 9/2005 | Sakaguchi | |
| 7,696,020 B2 | 4/2010 | Tayanaka | |
| 7,759,220 B2 | 7/2010 | Henley | |
| 2004/0097022 A1 * | 5/2004 | Werkhoven et al. | ........... 438/149 |
| 2005/0266626 A1 * | 12/2005 | Faure et al. | .................... 438/197 |
| 2006/0118513 A1 * | 6/2006 | Faure et al. | ..................... 216/33 |
| 2008/0303118 A1 | 12/2008 | Arena et al. | |
| 2009/0269875 A1 | 10/2009 | Kato et al. | |

FOREIGN PATENT DOCUMENTS

| | | |
|---|---|---|
| JP | 11-040786 | 2/1999 |
| JP | 11-097379 | 4/1999 |
| JP | 11-121310 | 4/1999 |
| JP | 2000-030995 | 1/2000 |

* cited by examiner

*Primary Examiner* — Julio J Maldonado
*Assistant Examiner* — Shantanu C Pathak
(74) *Attorney, Agent, or Firm* — Eric J. Robinson; Robinson Intellectual Property Law Office, P.C.

(57) ABSTRACT

A semiconductor substrate is provided by a method suitable for mass production. Further, a semiconductor substrate having an excellent characteristic with effective use of resources is provided. A single crystal semiconductor substrate is irradiated with ions to form a damaged region in the single crystal semiconductor substrate; an insulating layer is formed over the single crystal semiconductor substrate; the insulating layer and a supporting substrate are bonded to each other; a first single crystal semiconductor layer is formed over the supporting substrate by partially separating the single crystal semiconductor substrate at the damaged region; a first semiconductor layer is formed over the first single crystal semiconductor layer; a second semiconductor layer is formed over the first semiconductor layer with a different condition from that used for forming the first semiconductor layer; a second single crystal semiconductor layer is formed by improving crystallinity of the first and the second semiconductor layers.

42 Claims, 5 Drawing Sheets
(1 of 5 Drawing Sheet(s) Filed in Color)

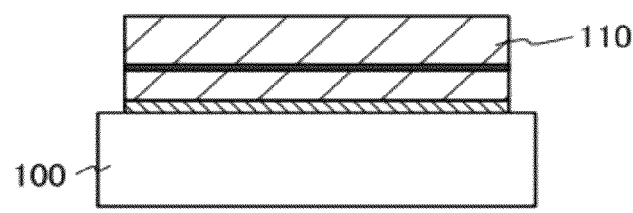
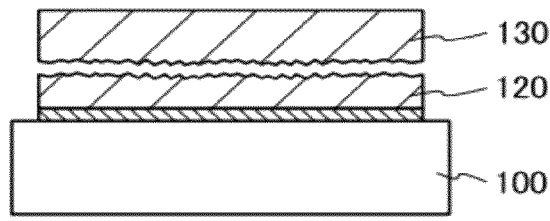
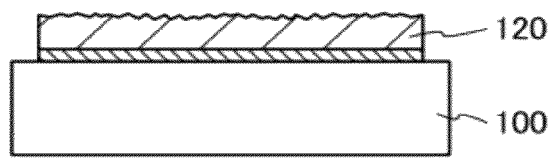

METHOD FOR MANUFACTURING SEMICONDUCTOR SUBSTRATE

BACKGROUND OF THE INVENTION

1. Field of the Invention

A technical field of the present invention relates to a method for manufacturing a semiconductor substrate.

2. Description of the Related Art

In recent years, an SOI (silicon on insulator) substrate has been used for a semiconductor device intended to high-performance. By utilizing characteristics of a thin single crystal silicon layer formed over an insulating layer, transistors formed in an integrated circuit can be electrically separated from each other completely. Further, each transistor can be formed as a fully-depleted transistor, and thus a semiconductor integrated circuit with high added value such as high integration, high speed driving, and low power consumption can be realized.

As a method for manufacturing such an SOI substrate, a hydrogen-ion-implantation separation method in which hydrogen ion implantation and separation are combined is known. A typical process of a hydrogen-ion-implantation separation method is described below.

First, hydrogen ions are implanted into a silicon substrate to form an ion implantation layer at a predetermined depth from the substrate surface. Then, another silicon substrate which serves as a base substrate (supporting substrate) is oxidized to form a silicon oxide layer. Then, the silicon substrate into which hydrogen ions are implanted are disposed in close contact with the silicon oxide layer of the another silicon substrate which serves as a base substrate so as to bond the two silicon substrates. Then, by performing heat treatment, one of the silicon substrates is separated at the ion implantation layer to form a thin single crystal silicon layer.

The single crystal silicon layer formed in a manner like the above-described method usually has a thickness of approximately 50 nm to 300 nm, and is very thin. Therefore, the single crystal silicon layer formed in a manner like the above-described method is really suitable to be used for a transistor of which high integration, high speed driving, and low power consumption are required. On the other hand, in the case where use of a power device, a photoelectric conversion device, and the like is considered, the single crystal silicon layer is required to have a certain thickness from the viewpoint of improvement in withstand voltage, photoelectric conversion efficiency, and the like.

The thickness of a single crystal silicon layer formed by an ion-implantation separation method mainly depends on acceleration voltage when ion implantation is performed. The single crystal silicon layer becomes thin when acceleration voltage is made low because an ion implantation layer is formed at a small depth from the surface of the single crystal semiconductor substrate. On the other hand, the single crystal semiconductor layer becomes thick when acceleration voltage is made high.

This shows that acceleration voltage needs to be increased simply to make the single crystal semiconductor layer thick. However, in reality, it is not easy to form a thick single crystal semiconductor layer by increasing acceleration voltage. This is because in the case of using an ion implantation apparatus suitable for mass production (an apparatus capable of supplying a large amount of current), it is difficult to have acceleration voltage higher than a certain level due to its limitation. In the case of using an apparatus in which small current is supplied, acceleration voltage can be increased. However, it takes time to obtain a predetermined injection volume of ions, so that it is not preferable in terms of productivity. Further, in the case of accelerating ions with a high voltage exceeding 100 kv, there is a problem in a safety standpoint because harmful radiation may be generated.

In order to solve the above-mentioned problems, a method is examined in which a single crystal semiconductor layer is made thick by epitaxial growth (e.g., see Reference 1: Japanese Published Patent Application No. 2000-30995).

SUMMARY OF THE INVENTION

The method described in reference 1 is as follow: a single crystal semiconductor layer formed by a hydrogen-ion-implantation separation method is subjected to vapor-phase growth (vapor-phase epitaxial growth) by a chemical vapor deposition (CVD) method or the like. However, it is difficult to increase a film-formation rate above a certain level when the single crystal semiconductor layer is formed by such a method. This becomes a major problem when mass production of semiconductor devices is considered.

In view of the foregoing problem, it is an object of the present invention to provide a semiconductor substrate by a method suitable for mass production. Further, it is another object of the present invention to provide a semiconductor substrate having an excellent characteristic with effective use of resources.

In one embodiment of the present invention disclosed in this specification (including at least the specification, the claims, and the drawings) and the like, a semiconductor substrate is manufactured with high productivity by using a solid-phase growth (solid-phase epitaxial growth) method. More specifically, the semiconductor substrate is manufactured through the following steps. First, a semiconductor layer having high crystallinity is formed thinly over a single crystal semiconductor layer which is formed by slicing a single crystal semiconductor substrate. Then, a semiconductor layer having low crystallinity is formed thickly over the semiconductor layer having high crystallinity. Subsequently, heat treatment or the like is performed on the above-mentioned layers having a stacked structure, so that the single crystal semiconductor layer whose thickness is increased by solid-phase growth is formed.

The above-mentioned "semiconductor layer having high crystallinity" can be formed by a plasma CVD method using a mixed gas of a silane based gas and hydrogen. For example, the "semiconductor layer having high crystallinity" can be formed using a mixed gas in which hydrogen is contained with a flow rate 50 times or more, preferably 100 times or more as high as that of the silane based gas. Because the "semiconductor layer having high crystallinity" is greatly influenced by the crystallinity of the single crystal semiconductor layer formed by slicing the single crystal semiconductor substrate, the above-mentioned manufacturing method can particularly be referred to as a vapor-phase growth (vapor-phase epitaxial growth) method. However, the crystallinity is not limited to being single crystal, and the "semiconductor layer having high crystallinity" is only required to have higher crystallinity than the "semiconductor layer having lower crystallinity" that is formed later.

The "semiconductor layer having lower crystallinity" may be formed by any method. For example, the "semiconductor layer having lower crystallinity" can be formed by a plasma CVD method using a mixed gas of a silane based gas and hydrogen similarly to the "semiconductor layer having higher crystallinity". In that case, a film-formation condition is preferably applied in which a film-formation rate of the "semiconductor layer having lower crystallinity" is higher than that of the "semiconductor layer having higher crystallinity". For example, the "semiconductor layer having lower crystallinity" can be formed using a source gas in which hydrogen is contained with a flow rate 2 to 20 times, preferably 5 to 15 times as high as that of the silane based gas.

The detail of a method for manufacturing a semiconductor substrate that is one embodiment of the disclosed present invention is as follows.

A method for manufacturing a semiconductor substrate that is one embodiment of the disclosed present invention is as follows: a single crystal semiconductor substrate is irradiated with ions so as to form a damaged region in the single crystal semiconductor substrate; an insulating layer is formed over the single crystal semiconductor substrate; the insulating layer and a supporting substrate are bonded to each other; the single crystal semiconductor substrate is separated at the damaged region, so that a first single crystal semiconductor layer is formed over the supporting substrate; a first semiconductor layer is formed over the first single crystal semiconductor layer; a second semiconductor layer is formed over the first semiconductor layer with a different condition from that used for forming the first semiconductor layer; crystallinity of the first semiconductor layer and the second semiconductor layer is improved by a solid-phase growth method to form a second single crystal semiconductor layer.

Another method for manufacturing a semiconductor substrate that is one embodiment of the disclosed present invention is as follows: a single crystal semiconductor substrate is irradiated with ions so as to form a damaged region in the single crystal semiconductor substrate; an insulating layer is formed over a supporting substrate; the single crystal semiconductor substrate and the insulating layer are bonded to each other; the single crystal semiconductor substrate is separated at the damaged region, so that a first single crystal semiconductor layer is formed over the supporting substrate; a first semiconductor layer is formed over the first single crystal semiconductor layer; a second semiconductor layer is formed over the first semiconductor layer with a different condition from that used for forming the first semiconductor layer; crystallinity of the first semiconductor layer and the second semiconductor layer is improved by a solid-phase growth method to form a second single crystal semiconductor layer.

In the above description, the first semiconductor layer and the second semiconductor layer are preferably formed so that the crystallinity of the first semiconductor layer is higher than that of the second semiconductor layer. Further, the first semiconductor layer and the second semiconductor layer are preferably formed so that hydrogen concentration of the first semiconductor layer is lower than that of the second semiconductor layer.

In addition, in the above description, the first semiconductor layer is preferably formed to have a thickness of from 10 nm to 100 nm inclusive, and the second semiconductor layer is preferably formed to have a thickness of 300 nm or more.

Furthermore, as the above-mentioned ions, ions generated from the source gas containing hydrogen are preferably used. Moreover, the first semiconductor layer is preferably formed by a plasma CVD method in which the flow rate of a hydrogen gas is 50 times or more as high as that of the silane based gas.

Further, a layer including a conductive material or a semiconductor layer including an impurity element may be provided between the first single crystal semiconductor layer and the supporting substrate.

Note that in this specification, the "single crystal" means a crystal whose crystal structure has certain regularity and in which the crystal axes are oriented in the same direction in any portion. However, in one embodiment of the disclosed invention, disorder of regularity such as a defect and lattice distortion is not excluded.

In one embodiment of the disclosed invention, a semiconductor layer having lower crystallinity (or a semiconductor layer in which hydrogen concentration is high) is formed and solid-phase growth of the semiconductor layer is performed; thus, a single crystal semiconductor layer is formed to be thick. Accordingly, the film-formation rate can be increased, and productivity of a semiconductor substrate is improved compared to the case where the single crystal semiconductor layer is formed only by vapor-phase growth. Further, in the present invention, after a crystalline semiconductor layer (also it is referred to as a buffer layer) is formed over the single crystal semiconductor layer that is formed by slicing the single crystal semiconductor substrate, a semiconductor layer having lower crystallinity (e.g., an amorphous semiconductor layer or the like) is formed. Accordingly, separation of the semiconductor layer when heat treatment for the solid-phase growth is performed can be prevented. That is, a single crystal semiconductor layer having sufficient thickness can be formed with high yield.

Further, in one embodiment of the disclosed invention, it is not necessary to separate the single crystal semiconductor layer thickly from the single crystal semiconductor substrate; thus, various problems caused by acceleration voltage in ion irradiation can be eliminated. In addition, the single crystal semiconductor substrate from which the single crystal semiconductor layer is separated can be used repeatedly; therefore, manufacturing cost of a semiconductor substrate can be suppressed.

As described above, according to one embodiment of the disclosed invention, a semiconductor substrate having excellent characteristics can be provided with high productivity.

BRIEF DESCRIPTION OF THE DRAWINGS

The patent or application file contains at least one drawing executed in color. Copies of this patent or patent application publication with the color drawing will be provided by the Office upon request and payment of the necessary fee.

FIGS. 1A to 1E illustrate a manufacturing process of a semiconductor substrate;

DETAILED DESCRIPTION OF THE INVENTION

Figure 2A:
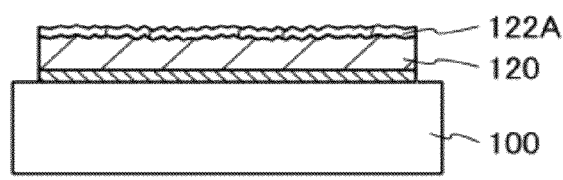
FIGS. 2A to 2C illustrate a manufacturing process of a semiconductor substrate.

Hereinafter, embodiments of the present invention will be described in detail with reference to the accompanying drawings. The present invention is not limited to the following description, and it is easily understood by those skilled in the art that modes and details herein disclosed can be modified in various ways without departing from the spirit and the scope of the present invention. This embodiment can be combined with the structure disclosed in other embodiments, as appropriate. Note that in structures of the present invention described hereinafter, like portions or portions having similar functions are denoted by the same reference numerals in different drawings, and description thereof is not repeated.

Embodiment 1

This embodiment describes an example of a method for manufacturing a semiconductor substrate according to one embodiment of the disclosed present invention with reference to FIGS. 1A to 1E, FIGS. 2A to 2C, and FIGS. 3A to 3C.

First, a supporting substrate 100 is prepared (see FIG. 1A). As the supporting substrate 100, a light-transmitting glass substrate used for a liquid crystal display device or the like can be used. As a glass substrate, a substrate having a strain point of from 580° C. to 680° C. inclusive, (preferably, from 600° C. to 700° C. inclusive) may be used. Further, it is preferable that the glass substrate be a non-alkali glass substrate. As a material of the non-alkali glass substrate, a glass material such as an aluminosilicate glass, an aluminoborosilicate glass, or a barium borosilicate glass is used, for example.

As the supporting substrate 100, as well as the glass substrate, a substrate which is formed of an insulator, such as a ceramic substrate, a quartz substrate, or a sapphire substrate; a substrate formed of a semiconductor such as silicon; a substrate which is formed of a conductor such as metal or stainless steel; or the like can be used.

Although not illustrated in this embodiment, an insulating layer may be formed on a surface of the supporting substrate 100. By providing the insulating layer, in the case where impurities (such as an alkaline metal or an alkaline earth metal) are contained in the supporting substrate 100, the impurities can be prevented from being diffused into the semiconductor layer. The insulating layer may have either a single-layer structure or a stacked structure. As a material used to form the insulating layer, silicon oxide, silicon nitride, silicon oxynitride, silicon nitride oxide, or the like can be used.

In this specification, an oxynitride is a substance that contains a large amount (number of atoms) of oxygen than that of nitrogen. For example, silicon oxynitride contains, for example, oxygen, nitrogen, silicon, and hydrogen at concentrations ranging from 50 at. % to 70 at. % inclusive, from 0.5 at. % to 15 at. % inclusive, from 25 at. % to 35 at. % inclusive, and from 0.1 at. % to 10 at. % inclusive, respectively. Further, nitride oxide contains a large amount (number of atoms) of nitrogen than oxygen and contains, for example, oxygen, nitrogen, silicon, and hydrogen at concentrations ranging from 5 at. % to 30 at. % inclusive, from 20 at. % to 55 at. % inclusive, from 25 at. % to 35 at. % inclusive, and from 10 at. % to 25 at. % inclusive, respectively. Note that the above-described ranges are ranges for the cases measured using Rutherford backscattering spectrometry (RBS) or hydrogen forward scattering (HFS). Moreover, the total for the content ratio of the constituent elements does not exceed 100 at. %.

Then, a single crystal semiconductor substrate 110 is prepared. As the single crystal semiconductor substrate 110, for example, a semiconductor substrate formed of a Group 4 element such as silicon, germanium, silicon germanium, or silicon carbide can be used. It is needless to say that a semiconductor substrate made of a compound semiconductor such as gallium arsenide or indium phosphide may be used as well. In this embodiment, a single crystal silicon substrate is used as the single crystal semiconductor substrate 110. There is not a limit on the size of the single crystal semiconductor substrate 110; however, for example, a circular semiconductor substrate having a diameter of 8 inches (200 mm), 12 inches (300 mm), 18 inches (450 mm), or the like can be processed into a rectangular shape to be used.

The single crystal semiconductor substrate 110 is subjected to various treatments to form a damaged region 114 and an insulating layer 116 (see FIG. 1B). The details of the various treatments will be described later with reference to FIGS. 3A to 3C. The damaged region 114 is a region where ions are introduced, and the single crystal semiconductor substrate 110 can be separated at the region. Therefore, depending on the depth at which the damaged region 114 is formed, the thickness of the single crystal semiconductor layer which is separated from the semiconductor substrate 110 is determined. In this invention, the damaged region 114 is formed at a depth of 50 nm to 300 nm inclusive from the surface of the single crystal semiconductor substrate 110.

Further, because the insulating layer 116 is a layer for bonding, the surface of the insulating layer 116 preferably has high planarity. As such an insulating layer 116, for example, a silicon oxide film formed by a chemical vapor deposition method using an organosilane gas can be used.

Then, the above-described supporting substrate 100 and single crystal semiconductor substrate 110 are bonded to each other (see FIG. 11C). Specifically, after cleaning the surfaces of the supporting substrate 100 and the insulating layer 116 by a method such as ultrasonic cleaning, the surface of the supporting substrate 100 and the surface of the insulating layer 116 are disposed to be in contact with each other. Then, pressure treatment is performed so that the surface of the supporting substrate 100 and the surface of the insulating layer 116 are bonded to each other. As bonding mechanism, mechanism relating to van der Waals' force, mechanism relating to hydrogen bonding, or the like is conceivable.

Before the bonding step, the surface of the supporting substrate 100 or the surface of the insulating layer 116 may be subjected to oxygen plasma treatment or ozone treatment so as to be hydrophilic. By this treatment, a hydroxyl is added to the surface of the supporting substrate 100 or the surface of the insulating layer 116, so that a hydrogen bond can be formed at a bonding interface.

Next, the supporting substrate 100 and the single crystal semiconductor substrate 110, which are bonded to each other, are subjected to heat treatment to have a stronger bonding therebetween. The heat temperature at this time needs to be a temperature that does not promote separation at the damaged region 114. For example, a temperature lower than 400° C., more preferably, 300° C. or less can be employed. The heat treatment time is not particularly limited and the optimal condition may be determined as appropriate from the relation between the treatment speed and the bonding strength. In this embodiment, heat treatment is performed at 200° C. for two hours. Here, only the region where bonding is performed can be locally heated by irradiating the region with microwaves. Note that in the case where the bonding strength is sufficient, the above heat treatment may be omitted.

Next, the single crystal semiconductor substrate 110 is separated into a first single crystal semiconductor layer 120 and a single crystal semiconductor substrate 130 at the damaged region 114 (see FIG. 1D). The separation of the single crystal semiconductor substrate 110 is performed by heat treatment. The temperature of the heat treatment can be determined in consideration of the allowable temperature limit of the supporting substrate 100. For example, in the case of using a glass substrate as the supporting substrate 100, the heat temperature is preferably from 400° C. to 650° C. inclusive. The upper limit of the heat temperature can be appropriately set depending on heat resistance of the supporting substrate 100. For example, if the supporting substrate 100 can withstand heat treatment at 750° C. or less, the heat treatment may be performed at a temperature 750° C. or less. In this embodiment, heat treatment is performed at 600° C. for two hours.

By performing the heat treatment as described above, the volume of microvoids formed in the damaged region 114 is changed, thereby generating a crack in the damaged region 114. Consequently, the single crystal semiconductor substrate 110 is separated at the damaged region 114. Because the insulating layer 116 is bonded to the supporting substrate 100, the first single crystal semiconductor layer 120 separated from the single crystal semiconductor substrate 110 remains over the supporting substrate 100. In addition, because the bonding interface between the supporting substrate 100 and the insulating layer 116 is heated by this heat treatment, a covalent bond is formed at the bonding interface, so that the bonding force between the supporting substrate 100 and the insulating layer 116 is further improved. Note that the single crystal semiconductor substrate 130 after the separation can be reused after a recycling process. The single crystal semiconductor substrate 130 after the recycling process may be used as a substrate from which a single crystal semiconductor layer is obtained or may be used for another purpose. When the single crystal semiconductor substrate 130 is used as a substrate from which a single crystal semiconductor layer is obtained, a plurality of semiconductor substrates can be manufactured using one single crystal semiconductor substrate.

In the semiconductor substrate formed as described above, defects due to the separation step or the ion irradiation step exist on the surface of the first single crystal semiconductor layer 120, and planarity of the surface is impaired. Thus, defect repair treatment or surface planarization treatment of the first single crystal semiconductor layer 120 may be performed. Note that the following defect repair treatment or surface planarization treatment is not necessarily performed.

As the defect repair treatment or surface planarization treatment, for example, laser light irradiation can be used. By irradiating the first single crystal semiconductor layer 120 with laser light from the above, an upper part of the first single crystal semiconductor layer 120 melts; then, is cooled down and solidified, whereby the defect is repaired and the surface planarity of the first single crystal semiconductor layer 120 is improved. When laser irradiation is performed, heat treatment may be performed within an allowable temperature limit of the supporting substrate. By heating the supporting substrate, defects can be reduced effectively.

Note that the first single crystal semiconductor layer 120 is partially melted by the laser light irradiation. This is because, if the first single crystal semiconductor layer 120 is completely melted, it is microcrystallized due to disordered nucleation after being in a liquid phase, so that crystallinity of the first single crystal semiconductor layer 120 is highly likely to decrease. On the contrary, by partial melting, crystal growth proceeds from a solid phase part, which is not melted. Accordingly, defects in the semiconductor layer can be reduced. Note that the term "complete melting" here means that the first single crystal semiconductor layer 120 is melted down to the vicinity of the lower interface of the first single crystal semiconductor layer 120 to be in a liquid state. On the other hand, in this case, the term "partial melting" means that the upper part of the first single crystal semiconductor layer 120 is melted to be in a liquid phase while the lower part thereof is not melted and is still in a solid phase.

A pulsed laser beam (pulsed laser) is preferably used for the laser light irradiation. This is because the partial melting state can be easily obtained by the use of a high-energy pulsed laser. It is preferable that the repetition rate be approximately 1 Hz to 10 MHz inclusive, more preferably, from 10 Hz to 1 MHz inclusive. As examples of oscillators of the above-described pulsed laser, an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, and the like can be given. Note that although it is preferable that a pulsed laser be used for partial melting, the present invention is not limited thereto. That is, the use of continuous wave lasers (CW laser) is not excluded. Note that, as examples of CW laser oscillators, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like can be given.

It is necessary that the wavelength of the laser light be set to a wavelength which can be absorbed by the first single crystal semiconductor layer 120. The wavelength may be determined in consideration of the skin depth of the laser light and the like. For example, the wavelength can be set in the range of 250 nm to 700 nm inclusive. Further, the energy density of the laser light can be determined in consideration of the wavelength of the laser light, the skin depth of the laser light, the thickness of the first single crystal semiconductor layer 120, or the like. For example, the energy density of laser light may be set in the range of 300 $mJ/cm^2$ to 800 $mJ/cm^2$ inclusive. The aforementioned range of the energy density is an example in which the first single crystal semiconductor layer 120 has a thickness of approximately 200 nm and a XeCl excimer laser (wavelength: 308 nm) is used as a pulsed laser oscillator.

The irradiation with the laser light can be performed in an atmosphere containing oxygen such as an air atmosphere or an inert atmosphere such as a nitrogen atmosphere. In order to perform irradiation with the laser light in an inert atmosphere, the irradiation with the laser light may be performed in an airtight chamber while the atmosphere in the chamber may be controlled. In the case of not using the chamber, a nitrogen atmosphere can be formed by blowing an inert gas such as a nitrogen gas to a surface which is irradiated with the laser light.

Note that performing irradiation with laser light in an inert atmosphere such as nitrogen has higher effect of improving planarity of the first single crystal semiconductor layer 120 than performing irradiation with laser light in the air atmosphere. In addition, the inert atmosphere has higher effect of suppressing generation of cracks and ridges than the air atmosphere, and the applicable energy density range for the laser light is widened. The irradiation with the laser light may be performed in vacuum. In the case of irradiation with the laser light in vacuum, the same effect as the case of irradiation in an inert atmosphere can be obtained.

In this embodiment, an example is described in which defect repair, surface planarization, and the like are performed by laser light irradiation; however, one embodiment of the disclosed invention is not limited thereto. For example, the surface of the first single crystal semiconductor layer 120 may be etched to eliminate defects, and planarization may be improved. Further, instead of the etching, polishing treatment such as chemical mechanical polishing (CMP) can be applied.

Accordingly, the semiconductor substrate having the first single crystal semiconductor layer 120 formed by being separated from the single crystal semiconductor substrate 110 can be manufactured. Note that in the following description, a case of using a semiconductor substrate on which the defect repair treatment or the surface planarization treatment is not performed is described (see FIG. 1E).

Then, a first semiconductor layer 122A is epitaxially grown (vapor-phase growth, vapor-phase epitaxial growth) over the first single crystal semiconductor layer 120 (see FIG. 2A). That is, the first semiconductor layer 122A is a semiconductor layer which is influenced by the crystallinity of the first single crystal semiconductor layer 120. Here, the first semiconductor layer 122A may be formed by selecting a material in accordance with the first single crystal semiconductor layer 120. In the case of forming a silicon layer as the first semiconductor layer 122A, the silicon layer can be formed by a plasma CVD method using a mixed gas of a silane based gas (typically, silane) and a hydrogen gas as a source gas. Further, the first semiconductor layer 122A is formed to have a thickness of approximately 5 nm to 100 nm inclusive, preferably approximately 10 nm to 50 nm inclusive.

The above-mentioned source gas is a mixed gas in which the flow rate of the hydrogen gas is 50 times or more (preferably, 100 times or more) as high as that of the silane based gas. For example, silane ($SiH_4$) and hydrogen may be mixed to be used with a flow rate of 4 sccm and 400 sccm, respectively. By increasing the flow rate of the hydrogen gas, a semiconductor layer having high crystallinity can be formed. Thus, hydrogen contained in the semiconductor layer can be reduced.

Note that as the silane based gas, it is not limited to using the above-mentioned silane, and disilane ($Si_2H_6$) or the like may be used. Further, a rare gas may be added to the source gas.

Other conditions when the first semiconductor layer 122A is formed by a plasma CVD method are as follows: a frequency is set at 10 MHz to 200 MHz inclusive; power, from 5 W to 50 W inclusive; pressure in the chamber, from 10 Pa to $10^3$ Pa inclusive; an electrode distance (in the case of a parallel-plate type), from 15 mm to 30 mm inclusive; the temperature of the supporting substrate 100, from 200° C. to 400° C. inclusive. The typical conditions of the above are as follows: a frequency, 60 MHz; power, 15 W; pressure in the chamber, 100 Pa; the electrode distance, 20 mm; and the temperature of the supporting substrate 100, 280° C. The above film formation conditions are only an example, and one embodiment of the disclosed invention should not be construed as being limited thereto. The important point here is to form a semiconductor layer having high crystallinity as the first semiconductor layer 122A (or a semiconductor in which hydrogen concentration is low or a semiconductor layer with a low hydrogen content); therefore, the first semiconductor layer 122A can be formed by any formation method as long as this object can be achieved.

Note that a native oxide layer and the like formed on a surface of the first single crystal semiconductor layer 120 are preferably removed before the first semiconductor layer 122A is epitaxially grown. This is because when an oxide layer is formed on the surface of the first single crystal semiconductor layer 120, the epitaxial growth which is influenced by the crystallinity of the first single crystal semiconductor layer 120 cannot proceed and the crystallinity of the first semiconductor layer 122A is decreased. Here, the oxide layer can be removed using a solution containing fluorinated acid, and the like.

Figure 2B:
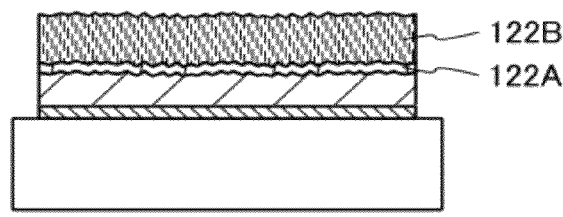

Then, a second semiconductor layer 122B is formed over the first semiconductor layer 122A (see FIG. 2B). Here, the second semiconductor layer 122B is formed by selecting a material in accordance with the first semiconductor layer 122A. In addition, the second semiconductor layer 122B is formed to have a thickness of 200 nm or more (preferably, 400 nm or more). At that time, the oxide layer formed over the first semiconductor layer 122A is preferably removed.

The second semiconductor layer 122B is formed to be a semiconductor layer of which crystallinity is lower than the first semiconductor layer 122A. Alternatively, the second semiconductor layer 122B is formed to be a semiconductor layer in which hydrogen concentration is higher than the first semiconductor layer 122A (a semiconductor layer with a high hydrogen content). As such a second semiconductor layer 122B, for example, an amorphous semiconductor layer may be formed.

The formation method of the second semiconductor layer 122B is determined as appropriate; however, the second semiconductor layer 122B is preferably formed under the condition in which the film-formation rate of the second semiconductor layer 122B is at least higher than that of the first semiconductor layer 122A. For example, when the second semiconductor layer 122B is formed by a plasma CVD method using a mixed gas of a silane based gas (typically, silane) and a hydrogen gas as a source gas, it is preferable that the flow rate of the hydrogen gas to the silane based gas be 2:1 to 20:1 inclusive (preferably, 5:1 to 15:1) inclusive. Further, it is preferable that a frequency be set at 10 MHz to 200 MHz inclusive; power, from 5 W to 50 W inclusive; pressure in the chamber, from 10 Pa to $10^3$ Pa inclusive; an electrode distance (in the case of a parallel-plate type), 15 mm to 30 mm inclusive; the temperature of the supporting substrate 100, from 200° C. to 400° C. inclusive. Typically, the flow rates of silane ($SiH_4$) and hydrogen are set at 25 sccm and 150 sccm, respectively; a frequency, 27 MHz; power, 30 W, pressure in the chamber, 66.6 Pa; the electrode distance, 25 mm; and the temperature of the substrate, 280° C. The above-mentioned film-formation conditions are only an example, and one embodiment of the disclosed invention should not be construed as being limited thereto. The important point here is to form a semiconductor layer which can be formed with higher film-formation rate even if the crystallinity thereof is low (or hydrogen concentration is high) as the second semiconductor layer 122B; therefore, the second semiconductor layer 122B can be formed by any formation method as long as this object can be achieved.

Figure 2C:
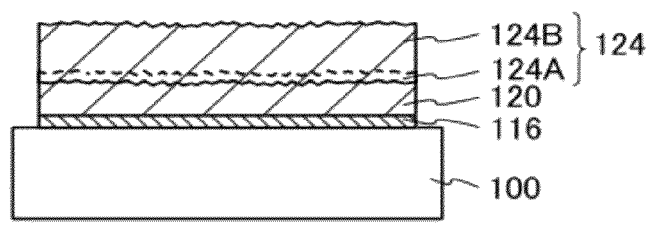

Subsequently, heat treatment is performed and a second single crystal semiconductor layer 124 is formed by solid-phase epitaxial growth (see FIG. 2C). Note that the first semiconductor layer 122A corresponds to a lower layer region 124A of the second single crystal semiconductor layer 124 and the second semiconductor layer 122B corresponds to an upper layer region 124B of the second single crystal semiconductor layer 124.

The above-mentioned heat treatment can be performed using a heat treatment apparatus such as a rapid thermal anneal (RTA), a furnace, a millimeter wave heating device, or the like. As a heating method of the heat treatment apparatus, a resistance heating method, a lamp heating method, a gas heating method, an electromagnetic wave heating method, and the like can be given. The heat treatment can be performed by laser beam irradiation or thermal plasma jet irradiation.

In general, a furnace is an external heating method, and the inside of a chamber and a processing object are in a thermal equilibrium state. On the other hand, an RTA is used for instantaneous heating (flash heating) by directly giving energy to a processing object, and the inside of a chamber and the processing object are in a thermal nonequilibrium state. For the RTA apparatus, an RTA apparatus by a lamp heating method (lamp rapid thermal anneal (LRTA)), an RTA apparatus by a gas heating method using a heated gas (gas rapid thermal anneal (GRTA)), an RTA apparatus by both a lamp heating method and a gas heating method, and the like can be given.

When the RTA apparatus is used, it is preferable that the process temperature be from 500° C. to 750° C. inclusive, and the processing time be from 0.5 minutes to 10 minutes inclusive. When the furnace is used, it is preferable that the process temperature be from 500° C. to 650° C. inclusive and the processing time be from 1 hour to 4 hours inclusive. Needless to say, it is not limited to this if the allowable temperature limit of the supporting substrate 100 permits.

Accordingly, a stacked structure of the first single crystal semiconductor layer 120 and the second single crystal semiconductor layer 124 can be formed. At this time, it is not preferable to use only a vapor-phase growth method in order to form the second single crystal semiconductor layer 124 thickly (e.g., 500 nm or more) in terms of the film-formation rate. On the other hand, in the case where the second single crystal semiconductor layer 124 is formed only by a solid-phase growth method in order to solve the problem of the film-formation rate, a problem of separation of a semiconductor layer due to heat treatment is generated. This is thought to result from large amounts of hydrogen contained in the semiconductor layer (e.g., an amorphous semiconductor layer) immediately after the film formation.

In this embodiment, after the first semiconductor layer 122A (a semiconductor layer having high crystallinity, a semiconductor layer in which hydrogen concentration is low, or a semiconductor layer formed by a method in which film-formation rate is low) is formed to be thin by vapor-phase growth, the second semiconductor layer 122B (a semiconductor layer having lower crystallinity, a semiconductor layer in which hydrogen concentration is high, or a semiconductor layer formed by a method in which film-formation rate is high) is formed to be thick, and then, the second single crystal semiconductor layer 124 is formed by solid-phase growth. Thus, the film formation rate is secured and the problem of separation of a semiconductor layer can be solved. That is, a single crystal semiconductor layer which has a predetermined thickness can be formed with high productivity and high yield.

The problem of separation is reduced by forming the stacked structure of the semiconductor layer having high crystallinity and the semiconductor layer having low crystallinity over the single crystal semiconductor layer and performing solid-phase growth as described above because difference in the crystallinity of adjacent layers becomes small, so that bonding between atoms at the interface is strengthened and adhesion is increased.

In this embodiment, although the semiconductor layer having high crystallinity (the first semiconductor layer 122A) is formed between the single crystal semiconductor layer (the first single crystal semiconductor layer 120) and the semiconductor layer having low crystallinity (the second semiconductor layer 122B), in consideration of the above reasons, the present invention should not be interpreted as being limited thereto. That is, a plurality of semiconductor layers having different crystallinity may be provided between the single crystal semiconductor layer and the semiconductor layer having low crystallinity. For example, a semiconductor layer having high crystallinity, a semiconductor layer having slightly higher crystallinity, and a semiconductor layer having low crystallinity are formed over the single crystal semiconductor layer in this order. With this structure, adhesion can be further improved.

Further, in terms of adhesion at the interface, the stacked structure is preferably formed so as to be exposed to air or the like as little as possible. For example, the first semiconductor layer 122A and the second semiconductor layer 122B may be formed continuously in the same chamber.

As described, a thick semiconductor substrate having a single crystal semiconductor layer can be manufactured. Note that in this embodiment, planarization treatment is not performed on the surface of the first single crystal semiconductor layer 120; thus, the surface of the second single crystal semiconductor layer 124 is largely influenced by the surface of the first single crystal semiconductor layer 120. Therefore, if necessary, the surface of the second single crystal semiconductor layer 124 may be planarized.

This embodiment describes the method in which the first single crystal semiconductor layer 120 and the second single crystal semiconductor layer 124 are formed over the supporting substrate 100 with the insulating layer 116 interposed therebetween; however, the present invention should not be interpreted as being limited thereto. For example, a layer having various functions, hereinafter referred to as a functional layer, may be provided in a lower part of the first single crystal semiconductor layer 120. For example, a layer containing a conductive material, a layer containing an impurity element (a semiconductor layer containing an impurity element), or the like may be formed as a functional layer.

Subsequently, a processing method of the single crystal semiconductor substrate 110 used in this embodiment is described with reference to FIGS. 3A to 3C.

Figure 3A:
FIGS. 3A to 3C illustrate a manufacturing process of a semiconductor substrate.

First, the single crystal semiconductor substrate 110 is prepared (see FIG. 3A). For the detail of the single crystal semiconductor substrate 110, the description of FIGS. 1A to 1E can be referred to; therefore, the detail is omitted here.

After cleaning the single crystal semiconductor substrate 110, an insulating layer 112 is formed on a surface of the single crystal semiconductor substrate 110. It is also possible that the insulating layer 112 is not provided; however, the insulating layer 112 is preferably provided in order to prevent contamination and surface damage of the single crystal semiconductor substrate 110 due to later ion irradiation. The thickness of the insulating layer 112 is preferably from 10 nm to 400 nm inclusive.

As a material for the insulating layer 112, silicon oxide, silicon nitride, silicon oxynitride, silicon nitride oxide, or the like can be given. As a method for forming the insulating layer 112, a CVD method, a sputtering method, a method of oxidizing (or nitriding) the single crystal semiconductor substrate 110, or the like can be used.

Figure 3B:
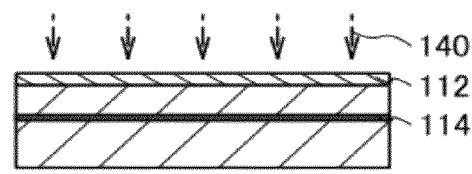

Next, an ion beam 140 including ions accelerated by an electric field is delivered to the single crystal semiconductor substrate 110 through the insulating layer 112, thereby forming the damaged region 114 in a region at a predetermined depth from the surface of the single crystal semiconductor substrate 110 (see FIG. 3B). The depth of the region where the damaged region 114 is formed can be controlled by the accelerating energy of the ion beam 140 and the incidence angle thereof. The damaged region 114 is formed at a depth the same or substantially the same as the average penetration depth of the ions.

Depending on the depth at which the damaged region 114 is formed, the thickness of the single crystal semiconductor layer which is separated from the single crystal semiconductor substrate 110 is determined. The depth at which the damaged region 114 is formed is 500 nm or less, preferably 400 nm or less, more preferably, from 50 nm to 300 nm inclusive from the surface of the single crystal semiconductor substrate 110. Because the thick single crystal semiconductor substrate remains after the separation, the number of times of reusing the single crystal semiconductor substrate can be increased. In the case where the damaged region 114 is formed at a small depth from the surface of the single crystal semiconductor substrate 110, acceleration voltage is decreased; thus productivity and the like should be considered.

An ion implantation apparatus or an ion doping apparatus can be used in order to irradiate the single crystal semiconductor substrate 110 with the ions. In an ion implantation apparatus, a source gas is excited to produce ion species, the produced ion species are mass-separated, and the ion species having a predetermined mass is delivered to a processing object. In an ion doping apparatus, a process gas is excited to produce ion species, the produced ion species are not mass-separated and are delivered to a processing object. Note that in an ion doping apparatus provided with a mass separator, ion implantation with mass separation can be performed similarly to the ion implantation apparatus.

The ion irradiation step in the case of using an ion doping apparatus can be performed in the following conditions, for example.

Accelerating voltage: from 10 kV to 100 kV inclusive (preferably from 30 kV to 80 kV inclusive)

Dose: from $1\times10^{16}/cm^2$ to $4\times10^{16}/cm^2$ inclusive

Beam current density: 2 $\mu A/cm^2$ or more (preferably 5 $\mu A/cm^2$ or more, more preferably 10 $\mu A/cm^2$ or more)

In the case of using an ion doping apparatus, a gas containing hydrogen can be used as a source gas of the ion irradiation step. By using the gas, $H^+$, $H_2^+$, and $H_3^+$ can be produced as ion species. In the case where a hydrogen gas is used as a source gas, it is preferable to perform irradiation with a large amount of $H_3^+$. Specifically, for example, it is preferably that the ion beam 140 contain $H_3^+$ ions at a proportion of 70% or higher with respect to the total number of $H^+$, $H_2^+$, and $H_3^+$ ions. It is more preferable that the proportion of $H_3^+$ ions be 80% or higher. With a high proportion of $H_3^+$ in this manner, the damaged region 114 can contain hydrogen at a concentration of $1\times10^{20}$ atoms/cm$^3$ or higher. Accordingly, separation at the damaged region 114 can be performed easily. By irradiation with a larger amount of $H_3^+$ ions, ion irradiation efficiency is improved compared to the case of irradiation with $H^+$ ions and $H_2^+$ ions. That is, time required for ion irradiation can be shortened. Note that the case where $H_3^+$ ions are used at high proportion is described here; however, there are no problem of increasing the proportion of the $H^+$ ions and $H_2^+$ ions.

In the case of using an ion implantation apparatus, it is preferable to perform mass separation to implant $H_3^+$ ions. Needless to say, irradiation with $H^+$ ions and $H_2^+$ ions may be performed as well. Note that, since ion species are selected to perform irradiation in the case of using an ion implantation apparatus, ion irradiation efficiency is decreased compared to the case of using an ion doping apparatus, in some cases.

As the source gas in the ion irradiation step, instead of a gas containing hydrogen, one or more kinds of gas selected from a rare gas such as helium or argon, a halogen gas typified by a fluorine gas or a chlorine gas, and a halogen compound gas such as a fluorine compound gas (e.g., $BF_3$) can be used. When helium is used for a source gas, the ion beam 140 with a high proportion of $He^+$ ions can be formed without mass separation. With the use of such an ion beam 140, the damaged region 114 can be efficiently formed.

Further, an ion irradiation step may be performed plural times to form the damaged region 114. In this case, the same source gas may be used in all ion irradiation steps or a different source gas may be used for each ion irradiation step. For example, ion irradiation may be performed using a rare gas as a source gas, and then, ion irradiation may be performed using a gas containing hydrogen as a source gas. Alternatively, ion irradiation may be performed first using a halogen gas or a halogen compound gas, and then, ion irradiation may be performed using a gas containing hydrogen.

Figure 3C:

After the damaged region 114 is formed, the insulating layer 112 is removed and the insulating layer 116 is formed (see FIG. 3C). Because the insulating layer 116 is a layer for bonding, the surface of the insulating layer 116 preferably has high planarity. As such an insulating layer 116, for example, a silicon oxide film formed by a chemical vapor deposition method using an organosilane gas can be used. Alternatively, a silicon nitride layer may be used.

The insulating layer 112 is removed here because the insulating layer 112 is likely to be damaged by the ion irradiation. Therefore, in the case where the damage of the insulating layer 112 by the ion irradiation has no problem, the insulating layer 116 may be formed over the insulating layer 112. Alternatively, the insulating layer 112 may be used as the insulating layer 116.

Accordingly, the semiconductor substrate illustrated in FIG. 1B can be obtained.

Embodiment 2

This embodiment describes, with reference to FIGS. 4A to 4D, the case where a conductive layer functioning as an electrode (or a wiring) is provided under the first single crystal semiconductor layer. Note that description of the common portion with Embodiment 1 is omitted.

Figure 4A:
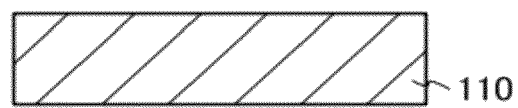
FIGS. 4A to 4D illustrate a manufacturing process of a semiconductor substrate.

First, the single crystal semiconductor substrate 110 is prepared (see FIG. 4A). For the detail of the single crystal semiconductor substrate 110, the description of Embodiment 1 can be referred to; therefore, the detail is omitted here.

After cleaning the single crystal semiconductor substrate 110, the insulating layer 112 is formed on a surface of the single crystal semiconductor substrate 110. The detail of the insulating layer 112 is also similar to that described in Embodiment 1.

Figure 4B:
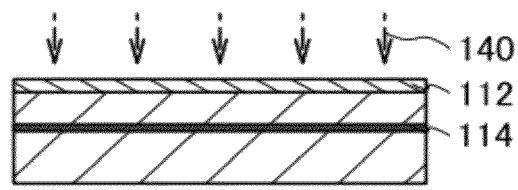

Next, the ion beam 140 including ions accelerated by an electric field is delivered to the single crystal semiconductor substrate 110 through the insulating layer 112, thereby forming the damaged region 114 in a region at a predetermined depth from the surface of the single crystal semiconductor substrate 110 (see FIG. 4B). For the detailed description thereon, Embodiment 1 can be referred to.

Figure 4C:
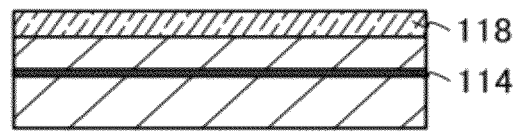

After the damaged region 114 is formed, the insulating layer 112 is removed, and a conductive layer 118 is formed (see FIG. 4C). The conductive layer 118 should have enough heat resistance to withstand heat treatment of a later step. Therefore, the conductive layer 118 is preferably formed using a high melting point metal material. For example, the conductive layer 118 can be formed using titanium, molybdenum, tungsten, tantalum, chromium, nickel, or the like. Further, a stacked structure of the aforementioned metal material and a nitride of the metal material can be used. For example, a stacked structure of a titanium nitride layer and a titanium layer, a stacked structure of a tantalum nitride layer and a tantalum layer, a stacked structure of a tungsten nitride layer and a tungsten layer, or the like can be used. Note that the conductive layer 118 can be formed by an evaporation method or a sputtering method. Further, when the conductive layer 118 is used as an electrode (or a wiring), the thickness thereof is preferably 100 nm or more.

Figure 4D:
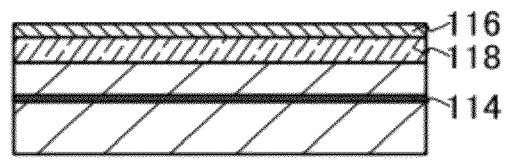

Then, the insulating layer 116 is formed over the conductive layer 118 (see FIG. 4D). The insulating layer 116 is a layer for bonding; thus, the surface of the insulating layer 116 preferably has high planarity. As such an insulating layer 116, for example, a silicon oxide film formed by a chemical vapor deposition method using an organosilane gas can be used. Alternatively, a silicon nitride layer may be used.

The subsequent steps after forming the insulating layer 116 are similar to those of Embodiment 1 (see FIGS. 1A to 1E and FIGS. 2A to 2C).

Note that in FIGS. 4A to 4D, the case is described in which after the insulating layer 112 is formed over the single crystal semiconductor substrate 110, ion irradiation is performed to form the damaged region 114; the insulating layer 112 is removed; and the conductive layer 118 and the insulating layer 116 are formed. However, the present invention is not limited thereto.

For example, the insulating layer may be formed over the conductive layer after forming the conductive layer on the surface of the single crystal semiconductor substrate and performing ion irradiation on the surface of the conductive layer to form the damaged region in a region at a predetermined depth from the surface of the single crystal semiconductor substrate. As described, by the formation of the conductive layer before the ion irradiation, the conductive layer can function as a protective layer, and the insulating layer 112 does not need to be provided separately. Accordingly, the process can be shortened.

Accordingly, a semiconductor substrate having a conductive layer functioning as an electrode (or a wiring) under a single crystal semiconductor layer can be provided. Note that the conductive layer is not limited to functioning as an electrode (or wiring). For example, the conductive layer may be used as a light-shielding layer using its light-shielding function. Furthermore, a semiconductor layer containing an impurity element may be formed by the same method as the conductive layer. This embodiment can be used in combination with Embodiment 1.

Example 1

Figure 5:
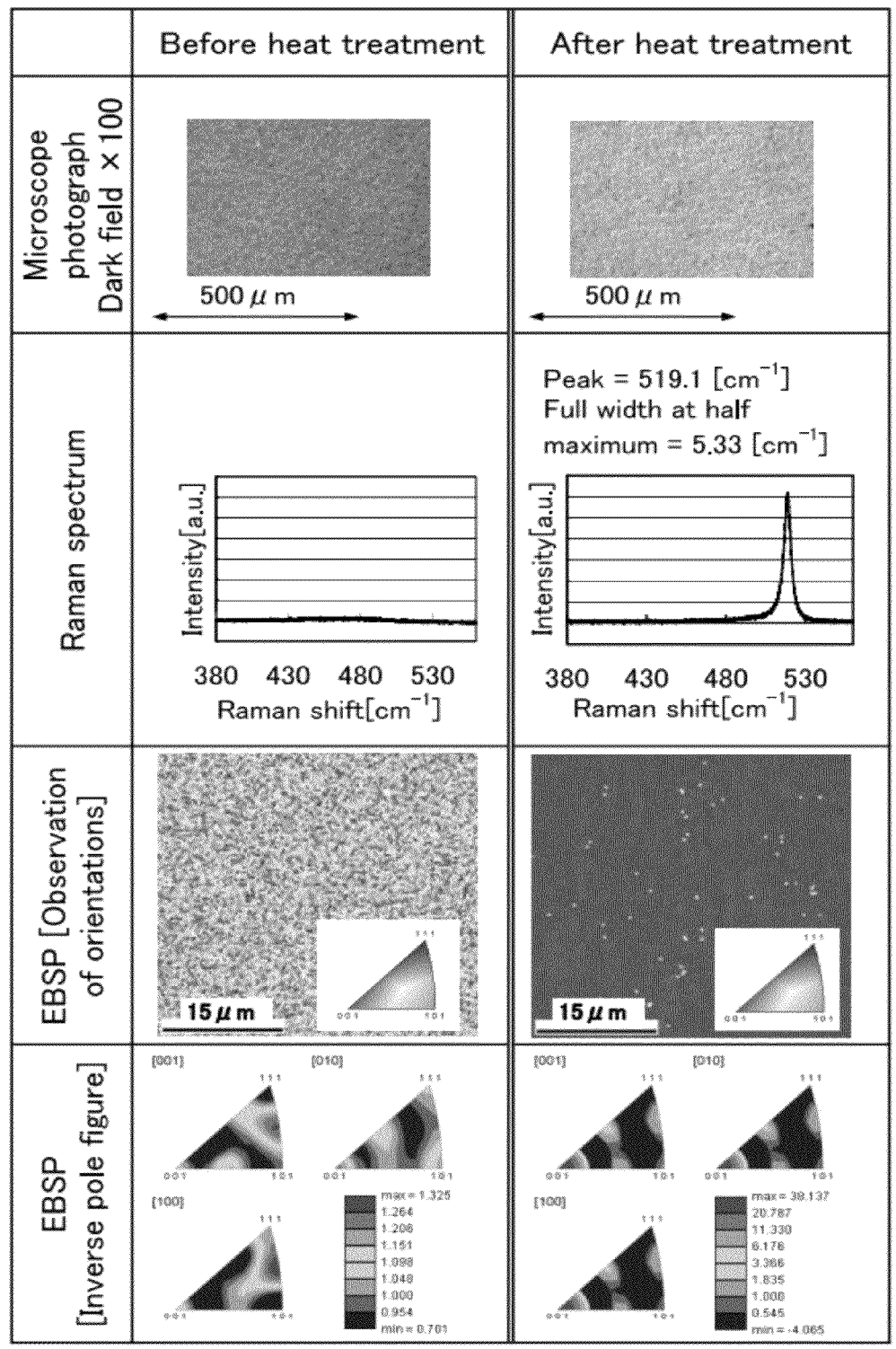
FIG. 5 illustrates observation results in Example 1.

This example describes, with reference to FIG. 5, characteristics of a single crystal silicon layer formed over the glass substrate using a method that is one embodiment of the disclosed invention.

First, a single crystal silicon layer is formed over a glass substrate by the method described in the above embodiments. In this example, a silicon oxide layer with a thickness of 50 nm, a silicon nitride oxide layer with a thickness of 50 nm, and a single crystal silicon layer with a thickness of 120 nm are stacked over a glass substrate with a thickness of 0.7 mm. Then, a silicon layer having high crystallinity and a silicon layer having low crystallinity are formed in this order over the single crystal silicon layer.

The manufacturing condition of the silicon layer having high crystallinity is as follows.
    film formation method: plasma CVD
    source gas: silane (4 sccm) and hydrogen (400 sccm)
    power (frequency): 15 W (60 MHz)
    pressure: 100 Pa
    electrode distance: 20 mm
    glass substrate temperature: 280° C.
    film thickness: 20 nm Further, the manufacturing condition of the silicon layer having low crystallinity is as follows.
    film formation method: plasma CVD
    source gas: silane (25 sccm) and hydrogen (150 sccm)
    power (frequency): 30 W (27 MHz)
    pressure: 66.6 Pa
    electrode distance: 25 mm
    glass substrate temperature: 280° C.
    film thickness: 480 nm The characteristics of a semiconductor layer are observed at the state where the silicon layer having low crystallinity is manufactured. Specifically, surface observation of the semiconductor layer using a microscope, Raman spectrum observation, and electron back scattering pattern (EBSP) observation are performed.

After that, the silicon layer having high crystallinity and the silicon layer having low crystallinity are single-crystallized by solid-phase growth (solid-phase epitaxial growth). Specifically, heat treatment at 650° C. is performed for six minutes using RTA apparatus by a gas heating method (gas rapid thermal anneal (GRTA)). Note that the silicon layer having high crystallinity formed in this example has properties which are extremely close to those of single crystal silicon; thus, the crystallinity of the silicon layer is not largely changed by the heat treatment. Needless to say, if the silicon layer having high crystallinity does not have properties which are close to those of single crystal silicon; the silicon layer is single-crystallized by solid-phase growth. At this stage, separation of the silicon layer is not generated. After the heat treatment, surface observation, Raman spectrum observation, and EBSP observation are performed again.

FIG. 5 illustrates the observation results. The left sides are observation results before the heat treatment, and the right sides are observation results after the heat treatment. From this comparison, it is observed that characteristics of the silicon layer are largely changed before and after the heat treatment. For example, a peak wavenumber of the Raman spectrum after the heat treatment is 519.1 $cm^{-1}$ and the peak is steep (the full width at half maximum is 5.33 $cm^{-1}$). Further, from the EBSP observation, it is observed that alignment of crystals is adequately in order and the crystals are substantially single-crystallized.

From the above-mentioned observation results, by the methods described in the present invention, a semiconductor substrate having excellent characteristics can be provided.

Comparative Example 1

For comparison, a silicon layer having low crystallinity is directly formed on a single crystal silicon layer, and heat treatment is performed thereon. Note that in this comparative example, instead of a stacked structure of a silicon layer having high crystallinity and a silicon layer having low crystallinity, a silicon layer having low crystallinity (film thickness: 500 nm) is used; however, other conditions are the same as those described in Example 1.

As a result of the heat treatment, in this comparative example, separation of the silicon layer having low crystallinity is generated. It would appear that adhesion between the single crystal silicon layer and the silicon layer having low crystallinity is small. From this comparative example, effectiveness of the manufacturing method that is one embodiment of the disclosed invention can be confirmed.

This application is based on Japanese Patent Application serial No. 2008-113320 filed with Japan Patent Office on Apr. 24, 2008, the entire contents of which are hereby incorporated by reference.

What is claimed is:

1. A method for manufacturing a semiconductor substrate, comprising:
    irradiating a single crystal semiconductor substrate with ions to form a damaged region in the single crystal semiconductor substrate;
    forming an insulating layer over the single crystal semiconductor substrate;
    bonding the insulating layer and a supporting substrate to each other;
    separating the single crystal semiconductor substrate at the damaged region to form a first single crystal semiconductor layer over the supporting substrate;
    forming a first semiconductor layer over the first single crystal semiconductor layer;
    forming a second semiconductor layer over the first semiconductor layer with a different condition from that used for forming the first semiconductor layer so that hydrogen concentration of the second semiconductor layer is higher than that of the first semiconductor layer; and improving crystallinity of the first semiconductor layer and the second semiconductor layer by a solid-phase growth to form a second single crystal semiconductor layer, wherein the first semiconductor layer and the second semiconductor layer are formed so that the crystallinity of the first semiconductor layer is higher than that of the second semiconductor layer.

2. The method for manufacturing a semiconductor substrate according to claim 1, wherein the first semiconductor layer is formed to have a thickness of from 10 nm to 50 nm inclusive, and the second semiconductor layer is formed to have a thickness of 300 nm or more.

3. The method for manufacturing a semiconductor substrate according to claim 1, wherein ions generated from a source gas containing hydrogen are used as the ions.

4. The method for manufacturing a semiconductor substrate according to claim 1, wherein the first semiconductor layer is formed by a plasma CVD in which a flow rate of a hydrogen gas is 50 times or more as high as that of a silane based gas.

5. The method for manufacturing a semiconductor substrate according to claim 1, wherein the method further comprises forming a layer including a conductive material or a semiconductor layer including an impurity element over the single crystal semiconductor substrate before the step of forming the insulating layer over the single crystal semiconductor substrate.

6. A method for manufacturing a semiconductor substrate, comprising:
irradiating a single crystal semiconductor substrate with ions to form a damaged region in the single crystal semiconductor substrate;
forming an insulating layer over a supporting substrate;
bonding the single crystal semiconductor substrate and the insulating layer to each other;
separating the single crystal semiconductor substrate at the damaged region to form a first single crystal semiconductor layer over the supporting substrate;
forming a first semiconductor layer over the first single crystal semiconductor layer;
forming a second semiconductor layer over the first semiconductor layer with a different condition from that used for forming the first semiconductor layer so that hydrogen concentration of the second semiconductor layer is higher than that of the first semiconductor layer; and
improving crystallinity of the first semiconductor layer and the second semiconductor layer by a solid-phase growth method to form a second single crystal semiconductor layer,
wherein the first semiconductor layer and the second semiconductor layer are formed so that the crystallinity of the first semiconductor layer is higher than that of the second semiconductor layer.

7. The method for manufacturing a semiconductor substrate according to claim 6, wherein the first semiconductor layer is formed to have a thickness of from 10 nm to 50 nm inclusive, and the second semiconductor layer is formed to have a thickness of 300 nm or more.

8. The method for manufacturing a semiconductor substrate according to claim 6, wherein ions generated from a source gas containing hydrogen are used as the ions.

9. The method for manufacturing a semiconductor substrate according to claim 6, wherein the first semiconductor layer is formed by a plasma CVD in which a flow rate of a hydrogen gas is 50 times or more as high as that of a silane based gas.

10. The method for manufacturing a semiconductor substrate according to claim 6, wherein the method further comprises forming a layer including a conductive material or a semiconductor layer including an impurity element over the single crystal semiconductor substrate before the step of forming the insulating layer over the supporting substrate or the step of bonding the single crystal semiconductor substrate and the insulating layer to each other.

11. A method for manufacturing a semiconductor substrate, comprising:
irradiating a single crystal semiconductor substrate with ions to form a damaged region in the single crystal semiconductor substrate;
forming an insulating layer over the single crystal semiconductor substrate;
bonding the insulating layer and a supporting substrate to each other;
separating the single crystal semiconductor substrate at the damaged region to form a first single crystal semiconductor layer over the supporting substrate;
forming a first semiconductor layer with a first thickness over the first single crystal semiconductor layer, the first semiconductor layer having a first crystallinity;
forming a second semiconductor layer with a second thickness over the first semiconductor layer, the second semiconductor layer having a second crystallinity lower than the first crystallinity, the second thickness greater than the first thickness; and
performing heat treatment so that the first crystallinity of the first semiconductor layer and the second crystallinity of the second semiconductor layer are improved.

12. The method for manufacturing a semiconductor substrate according to claim 11, wherein ions generated from a source gas containing hydrogen are used as the ions.

13. The method according to claim 11, wherein the first semiconductor layer is formed by plasma CVD.

14. The method according to claim 11, wherein the first semiconductor layer is epitaxially formed over the first single crystal semiconductor layer.

15. The method according to claim 11, wherein the second semiconductor layer is formed by plasma CVD.

16. The method according to claim 11, wherein a second single crystal semiconductor layer is formed by the heat treatment.

17. The method according to claim 11, wherein the heat treatment is performed by rapid thermal anneal.

18. The method according to claim 11, wherein the first thickness of the first semiconductor layer is 100 nm or less and the second thickness of the second semiconductor layer is 200 nm or larger.

19. A method for manufacturing a semiconductor substrate, comprising:
irradiating a single crystal semiconductor substrate with ions to form a damaged region in the single crystal semiconductor substrate,
forming an insulating layer over a supporting substrate;
bonding the single crystal semiconductor substrate and the insulating layer to each other;
separating the single crystal semiconductor substrate at the damaged region to form a first single crystal semiconductor layer over the supporting substrate;
forming a first semiconductor layer with a first thickness over the first single crystal semiconductor layer, the first semiconductor layer having a first crystallinity;

forming a second semiconductor layer with a second thickness over the first semiconductor layer, the second semiconductor layer having a second crystallinity lower than the first crystallinity, the second thickness greater than the first thickness; and performing heat treatment so that the first crystallinity of the first semiconductor layer and the second crystallinity of the second semiconductor layer are improved.

20. The method for manufacturing a semiconductor substrate according to claim 19, wherein ions generated from a source gas containing hydrogen are used as the ions.

21. The method according to claim 19, wherein the first semiconductor layer is formed by plasma CVD.

22. The method according to claim 19, wherein the first semiconductor layer is epitaxially formed over the first single crystal semiconductor layer.

23. The method according to claim 19, wherein the second semiconductor layer is formed by plasma CVD.

24. The method according to claim 19, wherein a second single crystal semiconductor layer is formed by the heat treatment.

25. The method according to claim 19, wherein the heat treatment is performed by rapid thermal anneal.

26. The method according to claim 19, wherein the first thickness of the first semiconductor layer is 100 nm or less and the second thickness of the second semiconductor layer is 200 nm or larger.

27. A method for manufacturing a semiconductor substrate, comprising:
irradiating a single crystal semiconductor substrate with ions to form a damaged region in the single crystal semiconductor substrate;
forming an insulating layer over the single crystal semiconductor substrate;
bonding the insulating layer and a supporting substrate to each other;
separating the single crystal semiconductor substrate at the damaged region to form a first single crystal semiconductor layer over the supporting substrate;
forming a first semiconductor layer over the first single crystal semiconductor layer, the first semiconductor layer having a first crystallinity;
forming a second semiconductor layer over the first semiconductor layer, the second semiconductor layer having a second crystallinity lower than the first crystallinity; and
performing heat treatment so that the first crystallinity of the first semiconductor layer and the second crystallinity of the second semiconductor layer are improved.

28. The method for manufacturing a semiconductor substrate according to claim 27, wherein ions generated from a source gas containing hydrogen are used as the ions.

29. The method according to claim 27, wherein the first semiconductor layer is formed by plasma CVD.

30. The method according to claim 27, wherein the first semiconductor layer is epitaxially formed over the first single crystal semiconductor layer.

31. The method according to claim 27, wherein the second semiconductor layer is formed by plasma CVD.

32. The method according to claim 27, wherein a second single crystal semiconductor layer is formed by the heat treatment.

33. The method according to claim 27, wherein the heat treatment is performed by rapid thermal anneal.

34. The method according to claim 27, wherein a thickness of the second semiconductor layer is greater than a thickness of the first semiconductor layer.

35. A method for manufacturing a semiconductor substrate, comprising:
irradiating a single crystal semiconductor substrate with ions to form a damaged region in the single crystal semiconductor substrate,
forming an insulating layer over a supporting substrate;
bonding the single crystal semiconductor substrate and the insulating layer to each other;
separating the single crystal semiconductor substrate at the damaged region to form a first single crystal semiconductor layer over the supporting substrate;
forming a first semiconductor layer over the first single crystal semiconductor layer, the first semiconductor layer having a first crystallinity;
forming a second semiconductor layer over the first semiconductor layer, the second semiconductor layer having a second crystallinity lower than the first crystallinity; and
performing heat treatment so that the first crystallinity of the first semiconductor layer and the second crystallinity of the second semiconductor layer are improved.

36. The method for manufacturing a semiconductor substrate according to claim 35, wherein ions generated from a source gas containing hydrogen are used as the ions.

37. The method according to claim 35, wherein the first semiconductor layer is formed by plasma CVD.

38. The method according to claim 35, wherein the first semiconductor layer is epitaxially formed over the first single crystal semiconductor layer.

39. The method according to claim 35, wherein the second semiconductor layer is formed by plasma CVD.

40. The method according to claim 35, wherein a second single crystal semiconductor layer is formed by the heat treatment.

41. The method according to claim 35, wherein the heat treatment is performed by rapid thermal anneal.

42. The method according to claim 35, wherein a thickness of the second semiconductor layer is greater than a thickness of the first semiconductor layer.

* * * * *